United States Patent
Oboukhov et al.

(10) Patent No.: US 12,028,091 B2
(45) Date of Patent: Jul. 2, 2024

(54) ADJUSTABLE CODE RATES AND DYNAMIC ECC IN A DATA STORAGE DEVICE WITH WRITE VERIFICATION

(71) Applicant: Western Digital Technologies, Inc., San Jose, CA (US)

(72) Inventors: Iouri Oboukhov, Rochester, MN (US); Derrick E. Burton, Irvine, CA (US); Weldon M. Hanson, Rochester, MN (US); Niranjay Ravindran, Rochester, MN (US); Richard Galbraith, Rochester, MN (US); Jonas Goode, Lake Forest, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/952,463

(22) Filed: Sep. 26, 2022

(65) Prior Publication Data

US 2024/0106461 A1  Mar. 28, 2024

(51) Int. Cl.
*H03M 13/11* (2006.01)
*H03M 13/00* (2006.01)

(52) U.S. Cl.
CPC ...... *H03M 13/1111* (2013.01); *H03M 13/611* (2013.01)

(58) Field of Classification Search
CPC .......................... H03M 13/1111; H03M 13/611
See application file for complete search history.

(56) References Cited

U.S. PATENT DOCUMENTS

| | | |
|---|---|---|
| 4,870,645 A | 9/1989 | Herron |
| 5,224,106 A | 6/1993 | Weng |
| 5,233,584 A | 8/1993 | Kulakowski |
| 7,107,505 B2 | 9/2006 | Thesling, III |
| 8,341,492 B2 | 12/2012 | Shen et al. |
| 8,601,352 B1 | 12/2013 | Anholt et al. |
| 8,677,205 B2 | 3/2014 | Ramaraju |
| 9,059,737 B2 | 6/2015 | Coker et al. |
| 9,489,260 B1 | 11/2016 | Hong |
| 9,632,863 B2 | 4/2017 | Galbraith et al. |
| 9,881,643 B1 | 1/2018 | Burton |

(Continued)

OTHER PUBLICATIONS

Kondoh et al., "A Study on Optimal BAR in Array Head Reading," IEEE Transactions on Magnetics, vol. 53, No. 11, Nov. 2017, 3 pgs. (abstract only).

(Continued)

*Primary Examiner* — Thien Nguyen
(74) *Attorney, Agent, or Firm* — Patent Law Works LLP

(57) ABSTRACT

Example channel circuits, data storage devices, and methods for using an adjustable code rate based on an extendable parity code matrix based on write verification determining extended parity are described. A data unit with a base set of parity bits may be written to a non-volatile storage medium and then read back for write verification. The data unit may be decoded using the base set of parity bits and corresponding primary parity matrix. Based on the decoding of the write verification read signal, a number of parity bits for an extended set of parity bits may be determined and the extended set of parity bits may be stored to an extended parity storage location for use during subsequent read operations.

20 Claims, 9 Drawing Sheets

(56) References Cited

U.S. PATENT DOCUMENTS

| | | |
|---|---|---|
| 10,437,674 B1 | 10/2019 | Sridhara et al. |
| 10,606,699 B2 | 3/2020 | Oboukhov et al. |
| 11,025,276 B2 | 6/2021 | Richardson et al. |
| 11,764,813 B1 | 9/2023 | Oboukhov |
| 2004/0093549 A1 | 5/2004 | Song |
| 2004/0199847 A1 | 10/2004 | Calabro |
| 2007/0011566 A1 | 1/2007 | Gray |
| 2009/0164864 A1 | 6/2009 | Matsumoto |
| 2010/0169736 A1 | 7/2010 | Garani |
| 2014/0026018 A1 | 1/2014 | Yang |
| 2014/0139942 A1 | 5/2014 | Grobis et al. |
| 2015/0128008 A1 | 5/2015 | Chatradhi et al. |
| 2015/0363262 A1* | 12/2015 | Hu ............... H03M 13/3738 714/773 |
| 2018/0034476 A1* | 2/2018 | Kayser ............ H03M 13/116 |
| 2019/0215016 A1* | 7/2019 | Cometti ............ G06F 3/0659 |
| 2020/0313696 A1 | 10/2020 | Matuz |
| 2022/0353010 A1* | 11/2022 | Oved ............... H04L 1/0002 |

OTHER PUBLICATIONS

Li et al., "Low-Density Parity-Check Codes With Run Length Limited (RLL) Constraints," IEEE Transactions on Magnetics, vol. 42, No. 2, Feb. 2006, pp. 344-349.

Matcha et al., "2-D LDPC Codes and Joint Detection and Decoding for Two-Dimensional Magnetic Recording," IEEE Transactions on Magnetics, vol. 54, No. 2, Feb. 2018, 11 pgs.

Mo et al., "Design and performance of LDPC codes extended with parity-check symbols from a larger alphabet," 2007 6th International Conference on Information, Communications & Signal Processing, Dec. 10-13, 2007, 3 pgs. (abstract only).

Suzutou et al., "Performance evaluation of LDPC coding and iterative decoding system in TDMR R/W channel with head skew," 2015 IEEE International Magnetics Conference (INTERMAG), May 11-15, 2015, 3 pgs. (abstract only).

Yang et al., "A Soft Decodable Concatenated LDPC Code," IEEE Transactions on Magnetics, vol. 15, No. 11, Nov. 2015, 3 pgs. (abstract only).

\* cited by examiner

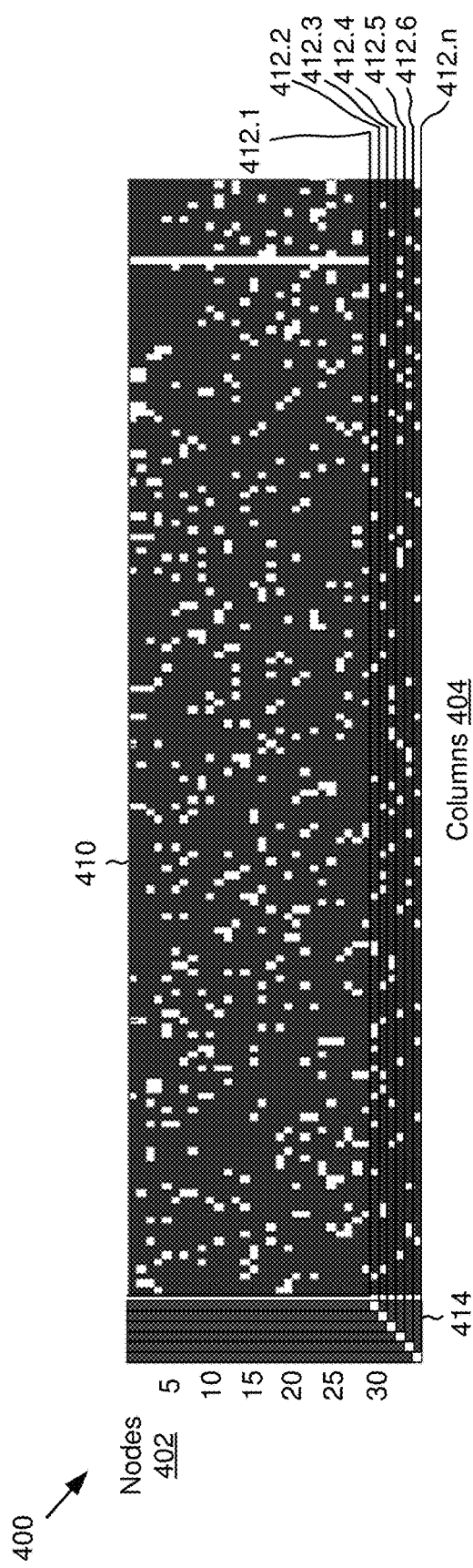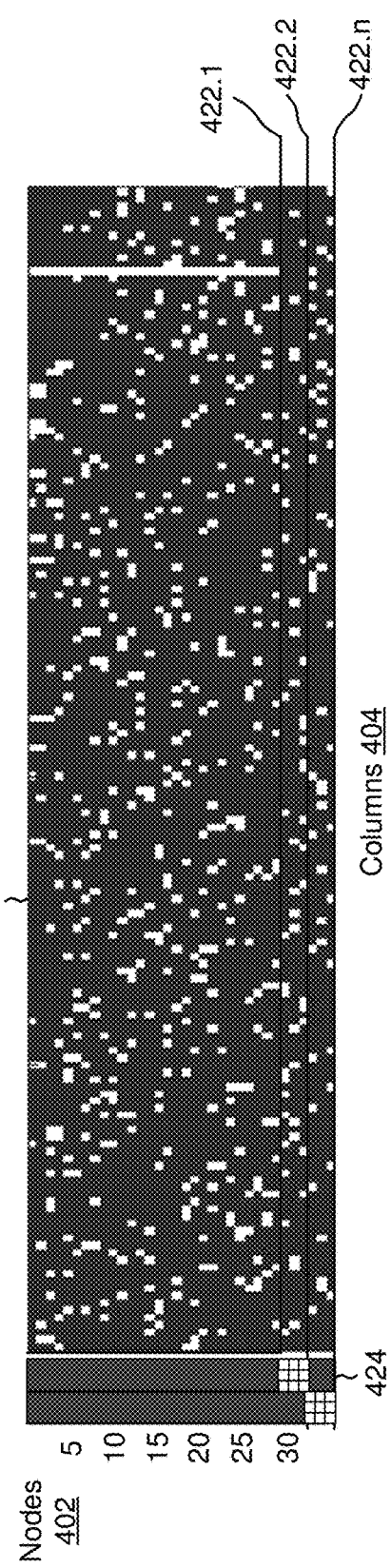
FIG. 4A
FIG. 4B

ADJUSTABLE CODE RATES AND DYNAMIC ECC IN A DATA STORAGE DEVICE WITH WRITE VERIFICATION

TECHNICAL FIELD

The present disclosure relates to read/write channel circuits for data storage devices. In particular, the present disclosure relates to extendable parity codes for varying code rates in error correction code (ECC) decode operations.

BACKGROUND

In present-day data transmission and storage mediums, such as disk, tape, optical, mechanical, and solid-state storage drives, data detection is based in large part on techniques developed in the early years of the data storage industry. While recently developed read channels invoke relatively new data encoding and detection schemes such as iterative detection and low-density parity codes (LDPC), much of the signal processing power in today's read channels is still based on partial-response maximum-likely-hood detection (PRML), developed in the early 1990's. Iterative LDPC code detectors use successive iterations and calculated reliability values to arrive at the most likely value for each bit. Soft information may be calculated for each bit and is sometimes represented by a log likelihood ratio (LLR) value, which is the natural logarithm of the ratio of the probability that the bit is a 1 divided by the probability that the bit is a 0. In some configurations a soft output Viterbi algorithm (SOVA) detector that determines LLR values for each bit may be paired with an iterative decoder for determining bias values for the next iteration of the S OVA. For example, a SOVA detector may be paired with an LDPC detector that receives bit LLR values, returns extrinsic LLR values, and outputs hard decisions when LDPC constraints are met.

The read/write channel may be configured with an error correction code (ECC) processor that decodes detected data bits (and/or likely data bit patterns from a soft information detector) based on an encoding and decoding scheme, such as LDPC codes. For example, the ECC processor may process sets of detected or likely data bits through a decoding parity matrix to decode a target data unit. Some read/write channels rely on a fixed parity matrix configured in hardware or software for a desired code rate and corresponding number of parity bits for the data on the storage medium. The number of parity bits may be selected as part of the data configuration and data units stored on the storage medium may include the parity data bits (in a fixed number and position) for the data unit, such as each codeword written to a page of non-volatile memory. It may be costly to include multiple parity matrices configured for different code rates in a read/write channel and prior storage formats may not support variable numbers of parity bits.

There is a need for technology that enables selective use of variable code rates and parity bit configurations.

SUMMARY

Various aspects for data storage devices with extendible parity code matrices are described, particularly read/write channels configured with a primary parity matrix and one or more extensions thereof that support multiple code rates and numbers of parity bits for different data units on the storage medium. Support for variable code rates may be combined with write verification to enable dynamic determination of extended parity based on the actual read response from a storage location on the non-volatile storage medium.

One general aspect includes a data storage device that includes a non-volatile storage medium, a write channel configured to calculate a first set of parity bits for a data unit and write the data unit and the first set of parity bits to the non-volatile storage medium, and an error correction code processor configured to: receive a first read signal for the data unit from the non-volatile storage medium; decode, using a primary parity matrix and the first set of parity bits from the first read signal, the data unit; selectively determine, responsive to decoding the data unit, an extended set of parity bits; and store the extended set of parity bits for the data unit to an extended parity storage location.

Implementations may include one or more of the following features. The error code processor may be further configured to: receive a second read signal for the data unit from the non-volatile storage medium, where the second read signal includes the first set of parity bits; receive the extended set of parity bits from the extended parity storage location; decode, based on the first set of parity bits and the extended set of parity bits, the data unit from the second read signal; and output a decoded data unit for the data unit. The first read signal may be a write verification read signal for the data unit responsive to a write operation and the second read signal may be a read operation read signal responsive to a read operation. The data storage device may include parity read logic configured to: determine the extended parity storage location for the data unit; and retrieve, during the read operation, the extended set of parity bits from the extended parity storage location. The error correction code processor may include a plurality of parity matrices, the plurality of parity matrices including: a primary parity matrix configured for a first code rate and first number of parity bits; and a plurality of extended parity matrices configured for a plurality of additional code rates and incrementally extended numbers of parity bits. The extended set of parity bits may correspond to: an incrementally extended number of parity bits; an adjusted code rate from the first code rate; and a corresponding extended parity matrix from the plurality of extended parity matrices. The non-volatile storage medium may include a plurality of memory cells of varying storage quality; the write channel may be further configured to write a plurality of data units to the plurality of memory cells; and the error correction code processor is further configured to selectively determine different code rates and different corresponding numbers of parity bits for the plurality of data units, and decode the plurality of data units using the different corresponding numbers of parity bits and the plurality of parity matrices. The error correction code processor may be further configured to: determine, based on decoding the data unit, a quality metric for the first read signal; compare the quality metric to at least one code rate threshold value; and select, based on the comparison of the quality metric to the at least on code rate threshold value, a number of extended parity bits for the extended set of parity bits corresponding to a desired code rate. The quality metric may be a mutual information metric from decoding the data unit; and the at least one code rate threshold value may include a plurality of mutual information metric threshold values corresponding to incrementally adjusted code rates. The write channel may be further configured to: write the data unit and the first set of parity bits to a first page in the non-volatile storage medium; and write, responsive to the error correction code processor determining the extended set of parity bits, the extended set of parity bits to a second page in the non-volatile storage medium. The second page in the non-volatile storage medium may include reserved memory cells unallocated to a storage capacity of the data storage device.

Another general aspect includes a method that includes: determining a data unit and a first set of parity bits for the data unit; writing, to a data storage location in a non-volatile storage medium, the data unit and the first set of parity bits; reading, from the data storage location in the non-volatile storage medium, the data unit and the first set of parity bits in a first read signal; decoding, using a primary parity matrix and the first set of parity bits from the first read signal, the data unit; selectively determining, responsive to decoding the data unit, an extended set of parity bits; and storing the extended set of parity bits for the data unit to an extended parity storage location.

Implementations may include one or more of the following features. The method may include: reading a second read signal for the data unit from the non-volatile storage medium, where the second read signal includes the data unit and the first set of parity bits; retrieving the extended set of parity bits from the extended parity storage location; decoding, based on the first set of parity bits and the extended set of parity bits, the data unit from the second read signal; and outputting a decoded data unit for the data unit. The first read signal may be a write verification read signal for the data unit responsive to a write operation; and the second read signal is may be read operation read signal responsive to a read operation. The method may include: determining the extended parity storage location for the data unit; and retrieving, during the read operation, the extended set of parity bits from the extended parity storage location. The method may include selecting, for decoding the data unit from the second read signal, a corresponding parity matrix from a plurality of parity matrices, where the plurality of parity matrices includes a primary parity matrix configured for a first code rate and first number of parity bits and a plurality of extended parity matrices configured for a plurality of additional code rates and incrementally extended numbers of parity bits. The extended set of parity bits may correspond to: an incrementally extended number of parity bits; an adjusted code rate from the first code rate; and the corresponding extended parity matrix from the plurality of extended parity matrices. The method may include: writing a plurality of data units to a plurality of memory cells in the non-volatile storage medium; selectively determining different code rates and different corresponding numbers of parity bits for the plurality of data units; and decoding, during read operations, the plurality of data units using the different corresponding numbers of parity bits and a parity matrix from the plurality of parity matrices. The method may include: determining, based on decoding the data unit, a quality metric for the first read signal; comparing the quality metric to at least one code rate threshold value; and selecting, based on the comparison of the quality metric to the at least on code rate threshold value, a number of extended parity bits for the extended set of parity bits corresponding to a desired code rate. The quality metric may be a mutual information metric from decoding the data unit; and the at least one code rate threshold value may include a plurality of mutual information metric threshold values corresponding to incrementally adjusted code rates. The method may include: writing the data unit and the first set of parity bits to a first page in the non-volatile storage medium; and writing, responsive to determining the extended set of parity bits, the extended set of parity bits to a second page in the non-volatile storage medium.

Still another general aspect includes a data storage device that includes: a non-volatile storage medium; means for determining a data unit and a first set of parity bits for the data unit; means for writing, to a data storage location in a non-volatile storage medium, the data unit and the first set of parity bits; means for reading, from the data storage location in the non-volatile storage medium, the data unit and the first set of parity bits in a first read signal; means for decoding, using a primary parity matrix and the first set of parity bits from the first read signal, the data unit; means for selectively determining, responsive to decoding the data unit, an extended set of parity bits; and means for storing the extended set of parity bits for the data unit to an extended parity storage location The present disclosure describes various aspects of innovative technology capable of improving error rates by supporting multiple code rates and numbers of parity bits for different data units on a storage medium with variable storage quality. The various embodiments include operations and control circuitry to overcome or at least reduce issues previously encountered in data storage devices and, accordingly, are more efficient, reliable, and/or higher performance than other data storage devices. That is, the various embodiments disclosed herein include hardware and/or software with functionality to improve data storage device performance, such as by using error correction codes and corresponding parity matrices that are extendable to support different code rates. Accordingly, the embodiments disclosed herein provide various improvements to data storage devices and computing systems incorporating such data storage devices.

BRIEF DESCRIPTION OF THE DRAWINGS

The techniques introduced herein are illustrated by way of example, and not by way of limitation, in the figures of the accompanying drawings in which like reference numerals are used to refer to similar elements.

FIGS. 4A and 4B are diagrams of example extendable parity matrices.

DETAILED DESCRIPTION

Novel data processing technology, such as but not limited to systems, data storage devices, read channels, and methods for detecting, decoding, and/or recovering previously encoded data in a data channel, such as a data storage read channel or data transmission receiver using adjustable code rates based on extended parity bits and corresponding extended parity matrices are disclosed. While this technology is described below in the context of a particular system architecture in various cases, it should be understood that the systems and methods can be applied to other architectures and organizations of hardware.

Figure 1A:
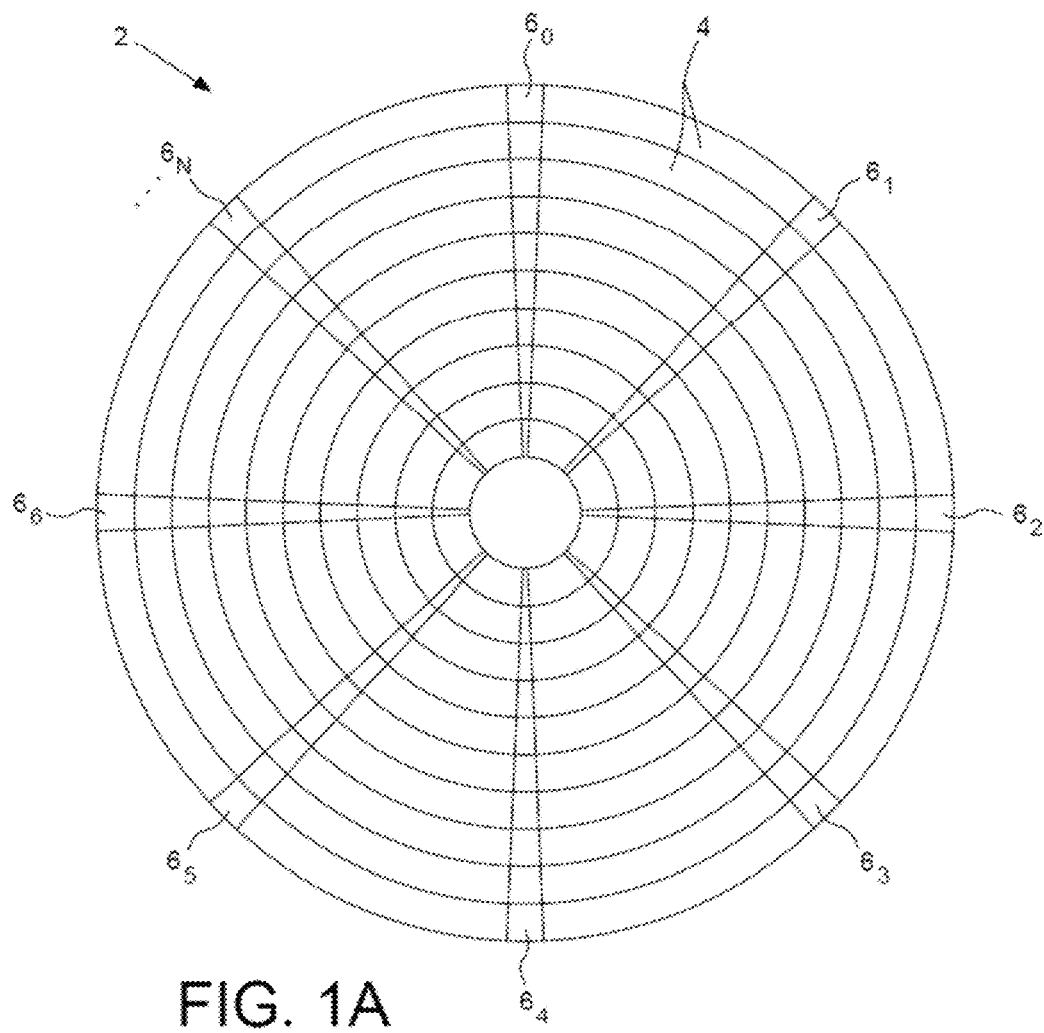
FIG. 1A is a diagram of a prior art disk format comprising a plurality of servo tracks defined by servo sectors.
Figure 1B:
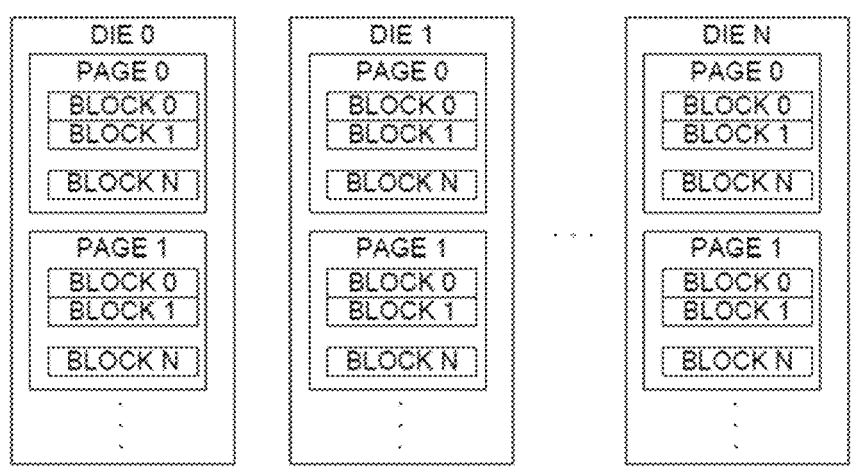
FIG. 1B is a block diagram of a prior art solid state drive format comprising a plurality of dies each comprising a plurality of pages.

In some examples, the data channel technology may be applied to a data storage read channel for recovering encoded data from a non-volatile storage medium. For example, the read channel may be incorporated in a data storage device, such as a hard disk drive (HDD), a solid-state drive (SSD), a flash drive, an optical drive, a tape drive, etc. FIG. 1A shows a prior art disk format 2 as comprising a number of servo tracks 4 defined by servo sectors $6_0$-$6_N$ recorded around the circumference of each servo track. Data tracks are defined relative to the servo tracks at the same or different radial density, wherein each data track comprises a plurality of data sectors. Each data sector may store the data symbols of a single codeword, or in other examples, each data sector may store symbols from multiple codewords (i.e., interleaved codewords). FIG. 1B shows a prior art die format for an SSD, wherein each die may store multiple pages and each page may store multiple blocks each corresponding to a data sector or other data unit of encoded binary data of a disk drive.

Figure 2:
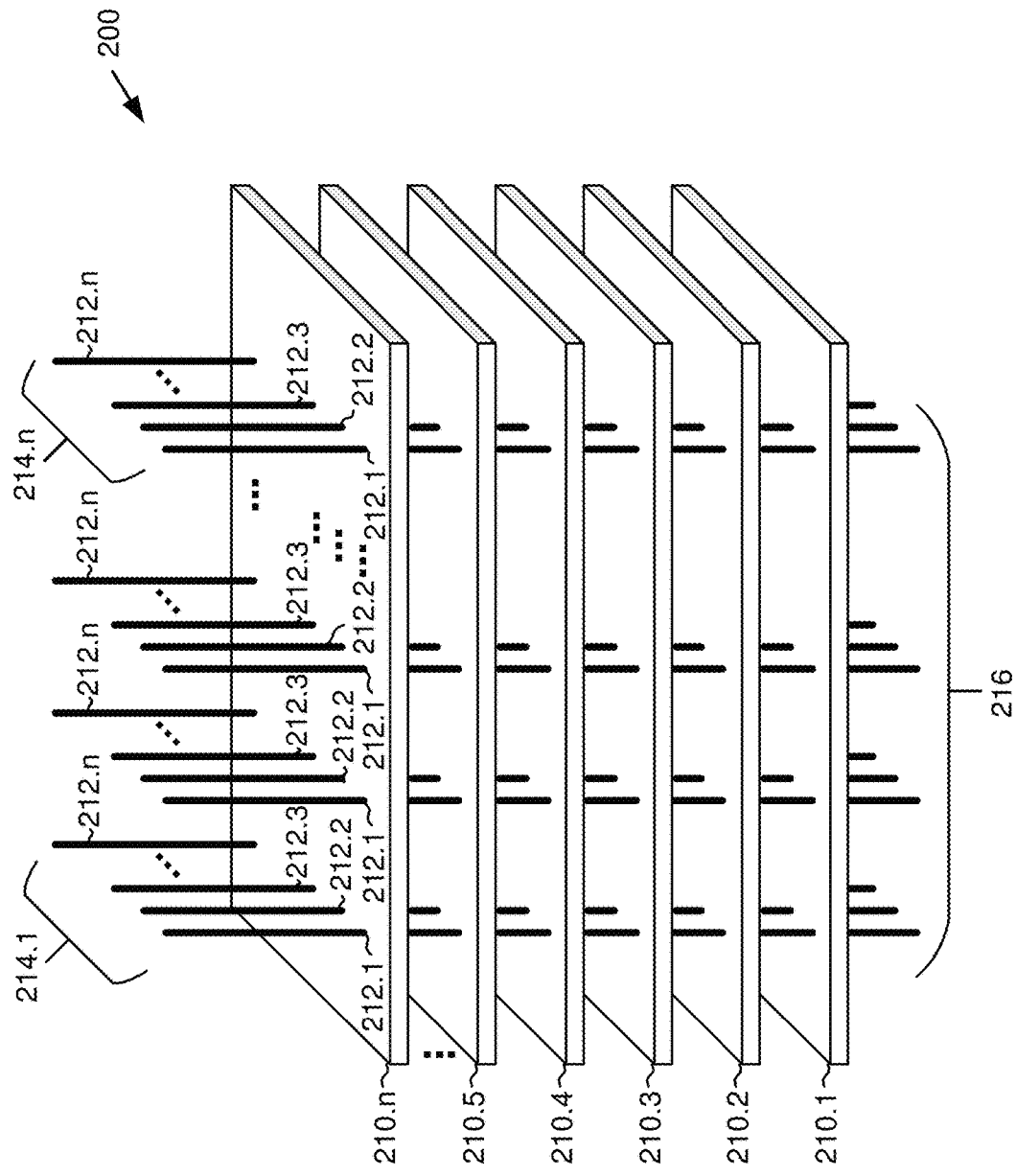
FIG. 2 is a more detailed diagram of a prior art solid state memory format defining memory cells at the junctions of bit lines and word lines.

FIG. 2 shows a prior art solid state memory architecture 200, such as may be used in the solid state die format in FIG. 1B, to define a multi-level matrix of memory cells at the junctions of bit lines and word lines. For example, solid state memory architecture 200 may include a plurality of parallel stacked word line plates 210.1-210.$n$ and, running perpendicular to word line plates 210, are a regularly spaced set of bit lines 212.1-212.$n$. In some configurations, each junction of word line plate 210 and a bit line 212 may define a memory cell. For example, in a NAND memory device, each memory cell may be configured as a NAND gate controlled by signals through the word lines of word line plates 210 and bit lines 212. Write voltages may be selectively applied to set the bit values of each memory cell and read voltages may be selectively applied to read the previously set bit values from each memory cell. Only a small portion of an example matrix of memory cells is shown in solid state memory architecture 200. For example, in a conventional NAND memory die, the number of physical bit lines may be 148,480 or more, in strings of 16 or 32, and word line plates may be stacked with 24 layers to more than 100 layers. The number of bit states in the memory cell may also vary by architecture, such as triple-level cells (TLC) and quad-level cells (QLC).

In some configurations, groups of memory cells may be written, read, and/or erased as pages. For example, a set of adjacent bit lines and the corresponding memory cells at the corresponding junction of each word line plate may comprise pages 214.1-214.$n$. In some configurations, strings of adjacent bit lines along the same word line plate may form a block 216. The read/write channel may be configured to use pages as a read/write/delete unit. For example, an error correction code (ECC) processor may construct LDPC codewords to be written as pages that include the encoded data unit and base parity bits for decoding those codewords. In such a configuration, each page may be considered a data storage location for a data unit and its base parity.

Figure 3:
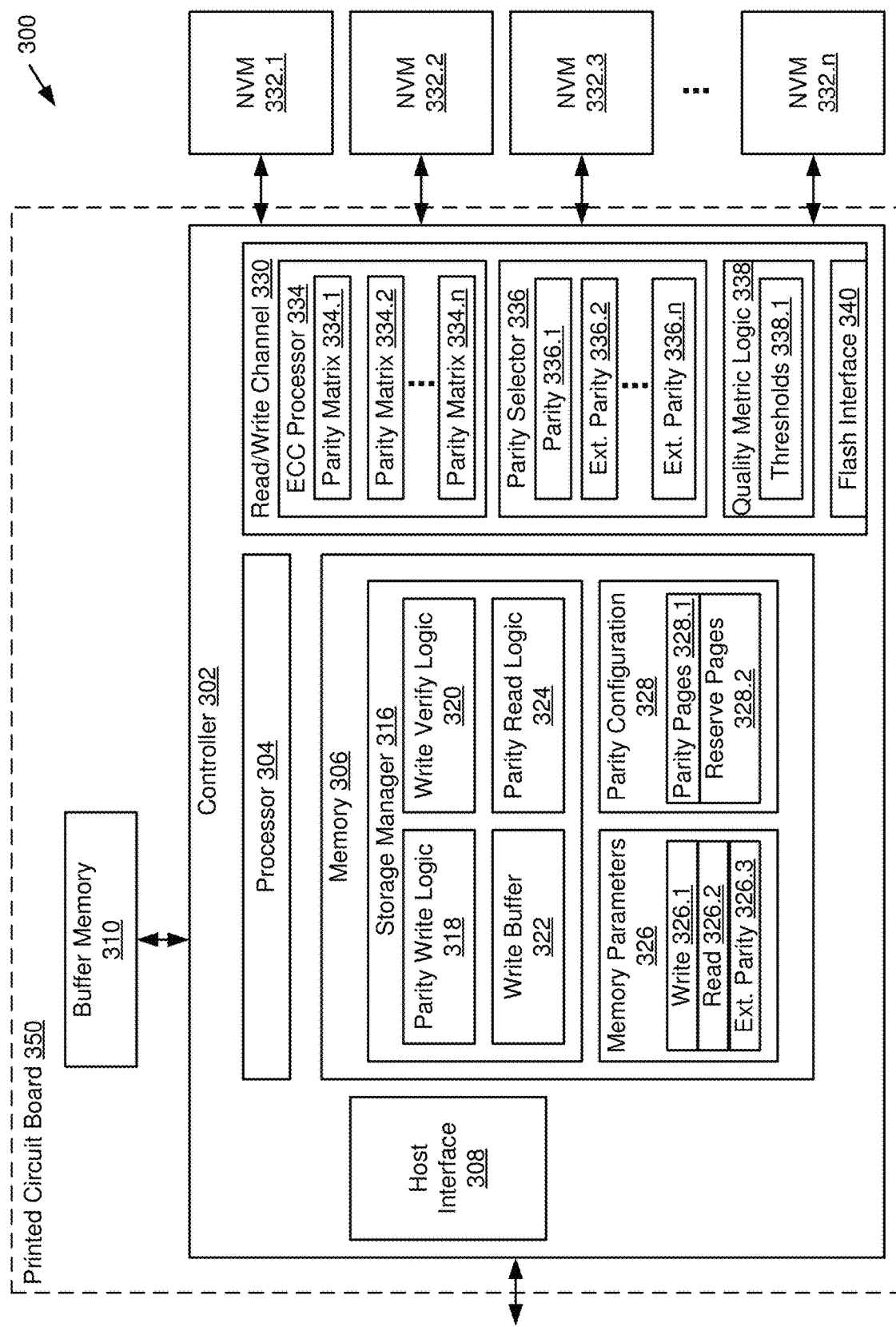
FIG. 3 is a block diagram of a configuration of data storage device electronics for a controller and read/write channel configured for extendable parity matrices.

FIG. 3 shows a portion of example control circuitry 300 for a data storage device, such as a solid state drive (SSD).

In the example shown, control circuitry 300 may include one or more controllers. Controller 302 may comprise a storage device controller configured to receive host storage commands, process storage operations for writing, reading, and managing data stored to non-volatile storage media in the SSD, such as the non-volatile memory in FIGS. 1B and 2. In some embodiments, controller 302 may correspond to a separate host interface and read/write path to a subset of memory dies in a data storage device with multiple controllers.

While for simplicity of description an SSD is used as the example data storage device, various embodiments are applicable to other forms of data storage devices such as hard disk drives (HDD) or tape drives comprising magnetic storage media and corresponding write and read transducers adjacent the magnetic storage medium. As shown in FIG. 3, control circuitry 300 may include a read/write channel 330 for interfacing with non-volatile memory 332.1-332.$n$. In some configurations, non-volatile memory 332.1-332.$n$ may include various forms for solid-state memory (such as NAND flash memory, NOR flash memory, magneto-resistive random access memory (MRAM), phase change memory (PCM), resistive random access memory (ReRAM)). In other configurations, non-volatile memory 332.1-332.$n$ may be replaced by read/write and media assemblies for HDD, tape drives, optical drives, etc. Those skilled in the art will recognize that the example references below to memory devices, dies, pages, blocks, etc. may be appropriately substituted with, or adapted to, corresponding physical or logical components or divisions within those forms of non-SSD data storage devices, and such description provided in this disclosure is not intended to limit the application of the described embodiments to SSD only.

Controller 302 may comprise a processor 304, a memory 306, a host interface 308, and access to a buffer memory 310. Controllers 302 may also comprise a read/write channel 330 for controlling the read/write paths to non-volatile memory 332. In some embodiments, one or more of host interface 308, read/write channel 330, and non-volatile memory 332 may be embodied in separate packages, such as application specific integrated circuits (ASICs), systems on a chip (SOCs), or other specialized circuits that interface with processor 304 and memory 306 for carrying out their respective functions. Controller 302 may include physical and electrical interfaces for connecting to buffer memory 310, a power source (not shown), other controllers, and/or other circuitry components. In some embodiments, the components of controller 302 may be interconnected by a bus that includes one or more conductors that permit communication among the components. For example, processor 304, memory 306, host interface 308, and read/write channel 330 may be components attached to a printed circuit board assembly (PCBA) 350 that provides one or more layers of interconnect conductors among the components. Non-volatile memory 332 may include one or more solid state memory packages, such as NAND memory, configured for non-volatile storage of data, such as host data received from a host system through host interface 308.

Processor 304 may include any type of conventional processor or microprocessor that interprets and executes instructions. Memory 306 may include a random access memory (RAM) or another type of dynamic storage device that stores information and instructions for execution by processor 304 and/or a read only memory (ROM) or another type of static storage device that stores static information and instructions for use by processor 304 and/or any suitable storage element, such as a system portion of non-volatile memory 332. Memory 306 may be configured to store controller firmware, comprising instructions that include one or more modules or sub-modules for specific data storage device operations and processor 304 may execute those instructions, including controlling communication with other components, such as host interface 308, buffer memory 310, and read/write channel 330. Example modules in memory 306 may include a storage manager 316, memory parameters 326, and a parity configuration 328.

Storage manager 316 may be configured to receive host storage commands through host interface 308 and determine storage operations to be executed by controller 302 using read/write channel 330 and non-volatile memory 332. For example, storage manager 316 may process read, write, delete, and similar commands targeting host data to be written to or read from the non-volatile storage medium of non-volatile memory 332. Processing a read operation may include applying a read voltage to the data storage location in non-volatile memory 332, receiving the read data in read/write channel 330, decoding the read data from non-volatile memory 332 into decoded bit data returned to storage manager 316 (and/or buffer memory 310). Processing a write operation may include applying a write voltage to the data storage location in non-volatile memory 332, and selectively changing the bit states in the memory cells of non-volatile memory 332.

Storage manager 316 may include parity write logic 318. For example, parity write logic 318 may assist storage manager 316 in determining and using parity configuration 328 to calculate and store parity data for each data unit written. Data units may include logical and physical sets of data bits written to and/or read from the non-volatile storage medium and may be used to refer to pages, blocks, and/or other data sets that receive corresponding parity encoding when stored to the storage medium. Parity write logic 318 may use read/write channel 330 to calculate parity for data units as they are written and then store that parity, as a set of parity bits, to non-volatile memory for use during the decoding portion of read operations. For example, parity write logic 318 may calculate parity based on the target data unit, the encoding scheme, and a number of parity bits for that scheme. Parity write logic 318 may store the parity bits in one or more sets of parity bits and one or more corresponding parity storage locations, such as parity data stored with the host data unit in a page and/or extended parity locations on separate parity pages or in another location. Note that extended parity may not be applied to all data units stored to the storage medium. For example, extended parity may only be applied to specific data units with higher bit error rates or other indicators of lower storage quality. In some configurations, parity write logic 318 may use write verify logic 320 to determine the quality of each data unit as it is written and selectively assign extended parity for higher code rates with improved read performance, when needed.

Parity write logic 318 may include functions, methods, and/or data structures for determining and storing both primary or base parity bits and one or more extended sets of parity bits. For example, parity write logic 318 may calculate parity from the data unit for a primary set of parity bits that includes a first portion of the total parity bits that corresponds to a minimum number of parity bits for the data unit and the primary parity matrix used for decoding operations. Parity write logic 318 may also calculate at least one extended set of parity bits from the data unit that include additional parity bits to provide a decreased code rate corresponding to an extended parity matrix. In some configurations, parity write logic 318 may calculate additional parity bits for an incremental series of extended sets of parity bits corresponding to incremental increases in code rate and improved decoding capabilities. For example, parity write logic 318 may calculate 32 parity bits for the data unit, where the first 28 parity bits are the primary parity bits, the next two parity bits (to position 30) are a first extended set of parity bits, and the last two parity bits (to position 32) are a second extended set of parity bits. Any number of extensions may be possible, including extensions greater than two, such as seven or more extensions. Each extension in the sequential series may correspond to an incremental increase in code rate, such as a 0.7% increase in code rate for each extension. These variable code rates may be configured to cover a range of code rates corresponding to different media regions, read/write characteristics, or other characteristics that can impact the base bit error rate and/or decoding capabilities of the read/write channel.

In some configurations, parity write logic 318 may calculate a maximum number of parity bits corresponding to a maximum code rate and largest parity matrix in read/write channel 330. For example, this maximum set of parity bits may be calculated and stored for each data unit receiving the extended parity protection. This may provide the maximum options for read operation recovery of the data unit. In some configurations, one or more extended sets of parity bits may be calculated and stored that are less than the maximum number, such as designating different bands with different code rates. In some configurations, the maximum number of parity bits may be calculated and stored temporarily, such as in write buffer 322, and then discarded once parity write logic 318 determines a desired code rate and the number of parity bits needed for that code rate. In some configurations, parity write logic 318 may use write verify logic 320 to read back the just written data unit and attempt to decode it based on the base parity. Parity write logic 318 may use one or more quality metrics based on the write verify read signal to determine the minimum code rate for the desired read performance. For example, quality metrics may include bit error rate, number of detector/decoder iterations, detector/decoder soft information, mutual information metrics, etc. In some configurations, the varying code rates and the extensions to the number of bits (and corresponding extended parity matrix) may be assigned to code rate threshold values for one or more quality metrics. For example, a desired code rate table or similar reference data structure may be accessed by parity write logic 318 to map different levels of the quality metric to desired code rates (and corresponding numbers of parity bits) for compensating for varying storage quality among pages, blocks, dies, or other subunits of non-volatile memory 332.

Write verify logic 320 (or other logic for read verification of writes), may be used to determine a bit error rate or other quality metric upon readback (e.g., using the primary parity bits) and a desired code rate table may map code rates to different ranges of bit error rate or another quality metric. For example, the iterative decoder of ECC processor 334 may generate soft information during the iterative detection and decoding of the data unit in the verification read signal. The soft information, such as log likelihood ratio values for the detected bit patterns, and the known input pattern (since the actual codeword written in the write operation is still known to storage manager 316 and/or read/write channel 330) may be used to calculate a mutual information metric. The mutual information metric may correspond to the amount/accuracy of the information contained in the bit, symbol, or data unit read from the storage medium. For example, an ideal mutual information value may be 1 and mutual information values less than 1 may represent decreasing accuracy of the verification read signal. The mutual information metric may be directly mapped to a code rate capable of decoding a data unit with that mutual information metric. For example, based on the incremental steps in the variable code rates, mutual information metric values may be allocated into bands corresponding to a plurality of code rate threshold values. So, a mutual information value higher than 0.9 may be assigned the base code rate and no extended parity may be necessary, a mutual information value from 0.8-0.9 may receive a first decreased code rate and extended parity, a mutual information value from 0.7-0.8 may receive a second decreased code rate and additional extended parity, a mutual information value from 0.5-0.7 may receive the minimum available code rate and maximum extended parity supported by the system, and a mutual information value less than 0.5 may indicate an unusable page. Other write or readback quality metrics may be used for selecting the desired code rate and number of parity bits.

Once the desired code rate and number of parity bits are determined, that number of parity bits may be committed to non-volatile memory, such as being written to a parity page or another parity storage location on the storage medium, or a different parity storage location, such as another area of non-volatile memory 532 reserved for system data or spare pages reserved for maintaining stated capacity (unallocated to host storage capacity). Parity write logic 318 may leave the data unit, base parity data, and/or maximum parity data for one or more write operations to write buffer 322 and maintain it until write verification logic 320 completes and the desired parity is written to a non-volatile parity storage location associated with the data unit and accessible to the read channel. In some configurations, write buffer 322 may include a parity buffer configured to accumulate extended parity bit sets for multiple data units to allow extended parity for a set of pages to be committed to a single extended parity page for more efficient parity write operations. Once the desired number of parity bits are committed for the data unit, the temporary storage in write buffer 322 for that data unit may be erased or overwritten, such as in a circular buffer configuration with a fixed number of slots corresponding to the maximum number of parity bits. In some SSD configurations, write verify logic 320 may be configured to determine read voltages and/or other read parameters for future reads of the stored data unit at that data storage location. For example, write verify logic 320 may determine read voltage levels based on the verification read signal and store those read parameters in memory parameters 326. In some configurations, an extended parity parameter indicating the size and/or location of the extended parity for that data unit or page may also be stored in memory parameters 326.

Storage manager 316 may include parity read logic 324. For example, parity read logic 324 may assist storage manager 316 and read/write channel 330 to access extended sets of parity bits for read operations. In some configurations, each data unit supported by extended parity may have at least two sets of corresponding parity bits, such as a set of primary parity bits and one or more extensions, and those parity bits may or may not be stored on the storage medium with the data unit. For example, extended parity bits for one or more pages may be stored continuously with the pages in a parity page among the set of pages, may be stored in an alternate location, such as an entirely separate set of extended parity pages, or may be stored in a separate portion of the storage medium, such as system or reserve pages. In configurations using write verify logic 320 to map the variable code rate to the actual read signal for the page, parity read logic 324 may apply the extended parity selectively determined at the time of writing to all subsequent read operations. Parity read logic 324 may assist read/write channel 330 in determining the number and location of parity bits to be used for a given decode operation. For example, memory parameters 326 for a given page may include both read parameters 326.2 used to set the read voltages and an extended parity parameter 326.3 that indicates the size and/or location of any extended parity bits for that page or data unit.

Parity read logic 324 may include functions, methods, and/or data structures for determining and accessing both primary parity bits and one or more extended sets of parity bits for a target data unit. In some configurations, extended parity may be stored in one or more extended parity pages associated with a group of host data pages. For example, parity configuration 328 may include a formatting allowance for parity pages 328.1 that store extended parity adjacent the set of host pages. Similarly, extended parity may be stored in a separate set of parity pages 328.1 allocated for extended parity for a particular die or other set of pages. In some configurations, parity pages may be allocated in reserve pages 328.2, such as a set of system pages, unallocated reserve pages, or other data areas not allocated to host data capacity.

Memory parameters 326 may include a parameter table or function accessible to storage manager 316, read/write channel 330, and/or non-volatile memory 332 for determining the sets of signal parameters used for write, read, delete, and/or other storage or maintenance operations to non-volatile memory 332. For example, memory parameters 326 may include write parameters 326.1 used to set write voltages, timing, or other signal parameters for writing and/or erasing pages or other data storage locations. Memory parameters 326 may include read parameters 326.2 used to set read voltages, timing, or other signal parameters for reading a read signal from pages or other data storage locations. In some configurations, memory parameters 326 may include an extended parity parameter 326.3 configured to indicate whether extended parity is available for a page or other data storage location. For example, extended parity parameter 326.3 may include a flag, extended parity location indicator, and/or number of bits indicator corresponding to the extended parity that was stored for that page or other data storage location.

Parity configuration 328 may store information regarding media regions allocated for storing base parity and/or extended parity data. For example, parity configuration 328 may include designation of parity pages 328.1 and how they map to pages allocated to data storage locations. In some embodiments, parity pages 328.1 may include a lookup table or function for determining the parity storage location for extended parity for a particular data unit or page. In some configurations, parity pages 326.1 may be allocated within the dies and pages allocated to host data storage on some regular interval or following other logic for managing extended parity in proximity to the pages it supports. In some configurations, parity pages 328.1 may be dynamically allocated within reserve pages 328.2. For example, a data storage device may include a certain number and configuration of pages reserved for system use and/or as spares for defect and wear that develops over time and use. Such parity pages allocated in reserve pages 328.2 may be migrated or lost over the life of the data storage device as those reserve pages are reallocated to other uses.

Host interface 308 may include any transceiver-like mechanism that enables the data storage device to communicate with other devices and/or systems, such as a host system for which the storage device provides data storage. Host interface 308 may comprise a host storage interface compliant with one or more storage interface standards, such as a Serial Advanced Technology Attachment (SATA) interface, a Small Computer System Interface (SCSI), serial attached SCSI (SAS), peripheral computer interface express (PCIe) (e.g., Non-Volatile Memory Express (NVMe)), etc., for connecting host interface 308 to peripheral interface or network port.

Buffer memory 310 may include a RAM, flash, or another type of dynamic storage device for storing host data and other information in transit between the storage media of the storage device and the host (via host interface 308). In some embodiments, buffer memory 310 is a separate memory device from memory 306 and the disk surfaces or other non-volatile memory of the data storage device.

Read/write channel 330 may include one or more specialized circuits configured for processing binary data to be written to the disk surfaces using an analog write signal and processing the analog read signal from the disk surfaces back into binary data. For example, read/write channel 330 may include a write path comprised of various data scramblers, run-length limited (RLL) encoders, iterative error correction code (ECC) encoders, precompensation circuits, and other data or signal processing components. Read/write channel 330 may include a read path comprised of various amplifiers, filters, equalizers, analog-to-digital converters (ADCs), soft information detectors, iterative ECC decoders, and other data or signal processing components. The write channel components may comprise a write channel circuit and the read channel components may comprise a read channel circuit, though the circuits may share some components. Read/write channel 330 may provide the analog write signal to and receive the analog read signal from non-volatile memory 332, which controls and amplifies signals to and from the heads. Binary data for recording to the storage medium may be received by read/write channel 330 from storage manager 316 and decoded data from read/write channel 330 may be passed to storage manager 316 and/or directed to buffer memory 310 for communication to the host.

In some configurations, read write channel 330 may include an ECC processor 334 configured to receive read data for a data track from the read heads and use iterative ECC processing to decode the received read data into decoded data for further processing by storage manager 316 and/or communication to the host. For example, ECC processor 334 may include one or more soft output Viterbi algorithm (SOVA) detectors and low density parity check (LDPC) decoders operating on multi-bit encoded symbols to decode each sector of data received by read/write channel 330. Iterative decoding may be based on soft information, such as log-likelihood ratios (LLR), generated from SOVA detectors and/or LDPC decoders. In some configurations, ECC processor 334 may include logic for parity sector decoding that uses parity stored in sectors at the end of a data track to provide additional soft information for decoding the original codewords (and/or extended parity) read for each data sector. In some configurations, ECC processor 334 may include logic for soft track ECC to generate soft information for the data sectors in the track in addition to the LDPC soft information generated for each codeword.

ECC processor 334 may include a parity matrix to support decoding operations, such as an H-matrix for the LDPC code used to decode a target data unit, that is populated and executed using the target data unit and a corresponding set of parity data. ECC processor 334 may support a plurality of parity matrices and, more specifically, an extendable set of parity matrices where each parity matrix is an extension of the prior parity matrix that includes the nodes of that prior parity matrix. For example, the plurality of parity matrices may include a primary parity matrix 334.1 and any number of extensions to that parity matrix, such as extended parity matrix 334.2 and extended parity matrix 334.$n$. ECC processor 334 may use any one of the parity matrices based on the parity bits available for the decode operation. For example, some data units may be decoded using primary parity matrix 334.1 and other data units may be decoded using extended parity matrix 334.2 or extended parity matrix 334.$n$. As described above, different decode attempts may use different sets of parity bits and corresponding parity matrices. Each of the plurality of parity matrices may correspond to a different code rate with increasing decoding capabilities. ECC processor 334 may operate on a data unit stored in a buffer memory of read/write channel 330. In some configurations, ECC processor 334 may perform multiple sequential decode operations (using extended parity bits and matrices) on the data unit stored in the channel data buffer without an intervening read operation from the storage medium. ECC processor 334 may receive one or more sets of parity bits for a data unit from parity selector 336.

Read/write channel 330 may include a parity selector 336 for managing multiple sets of parity bits for the same data unit. For example, a data unit configured with extended parity may include a set of primary parity bits 336.1 and one or more sets of extended parity bits, such as extended parity bits 336.2 and 336.$n$. Parity selector 336 may provide a selected set of parity bits for a particular decode operation by ECC processor 334. For example, parity selector 336 may store a set of parity bits to a parity buffer or register for use by ECC processor 334. The number of parity bits in the selected set of parity bits for the operation may be used by ECC processor 334 to determine the corresponding parity matrix to be used for the decode operation. In some configurations, parity selector 336 may determine the set of parity bits for a data unit based on parity read logic 324, and provide that set of parity bits to ECC processor 334 for the decode operation. In some configurations, parity selector may be configured to select the base set of parity bits to support write verify logic 320 and, following write verification, use the extended set of parity bits for the desired code rate for that page or data unit based on parity read logic 324.

In some configurations, read/write channel 330 may be configured with quality metric logic 338 for calculating one or more quality metrics from the decode operation of write verification logic 320. For example, quality metric logic 338 may calculate bit error rate (BER), a mutual information metric, or other quality metrics. In some configurations, quality metric logic 338 may compare the output of ECC processor 334 with the known input signal during a verification read to determine the quality metric. In some configurations, quality metric logic 338 may include a series of code rate thresholds 336.1 corresponding to different desired code rates that enable a page or data unit with that quality metric to reliably be decoded. For example, code rate thresholds 336.1 may define different ranges of a mutual information metric or raw BER from the verification read and map each range to a desired code rate and corresponding number of base or extended parity bits. In some configurations, quality metric logic 338 and/or code rate thresholds 338.1 may be embodied in storage manager 316 and may receive decode metrics from ECC processor 334 for calculating quality metrics and applying those quality metrics to code rate thresholds 338.1

Flash interface 340 may provide a physical and/or logical interface to non-volatile memory 332 for read, write, erase, and management operations. For example, flash interface 340 may enable read/wrote channel 330 to send write data signals to non-volatile memory 332 and receive read data signal from non-volatile memory 332. In some configurations, the components of controller 302 may interface with non-volatile memory packages 332 through flash interface 340.

FIGS. 4A and 4B show an example node distribution 410 for an extended parity matrix 400 that may be used in conjunction with control circuitry 300 in FIG. 3 and/or the methods of FIGS. 9-13. Typically, the structure of an LDPC H-matrix is shown as set of nodes. Light squares represent a 1-node, black squares represent a 0-node. To scale up nodes of an H-matrix by n-times to an actual bit H-matrix of the desired sector size, each node is replaced by an identity matrix n×n for 1-nodes and a zero n×n matrix for 0-nodes. Similar scaling could be achieved by using permutation matrices instead of identity. This may help to develop optimal search procedure to eliminate 4- and 6-cycles from the final bit H-matrix.

FIG. 4A shows primary node H-matrix 410 which is extended by additional rows from line 412.1 to line 412.$n$. Parity nodes 402 are shown on the left. They have column weight 1. This construction may be used when additional parity bits are stored in flash storage and is protected there by separate ECC. In this construction, very fine extension steps equal to a single node may be achieved. For example, each line from 412.1 to 412.$n$ is a cumulative extension of one parity node corresponding to extended parity bits 414.

FIG. 4B shows a primary node H-matrix 420 that is also extended by additional rows from line 422.1 to line 422.2 to line 422.$n$. In this case, extended parity bits 424 are grouped in 3×3 node clusters. This construction allows for storing additional parity using less space, such as on the same disk, with strong protection defined by column weight 3 for each parity bit. In this case the step in H-matrix extension will be larger, in comparison with case in FIG. 4A.

While example numbers of extensions are shown in FIGS. 4A and 4B, any number of extended parity matrices could be configured in this way, where each sequential expansion of the parity matrix includes the prior parity matrix. This configuration may allow overlapping circuitry and/or firmware to be used for the series of parity matrices. Each extended parity matrix incrementally changes the code rate relative to the prior parity matrix. In some configurations, this change in code rate may be linear and/or configured to equal a predetermined step in code rate. In some configurations, extended parity matrix 400 may be configured for a population of storage devices based on a set of LDPC codes that define the number of parity bits used for each matrix, the size of the data unit being decoded, and the distribution of nodes for executing that matrix.

Construction of "good" extended LDPC H-matrices may start from a primary node matrix. For this primary parity matrix, the minimal column weight may be defined and searched for the absence of 4- and 6-cycles until this condition is fulfilled. After the primary node matrix is determined, desired extensions of the primary node matrix may be determined, keeping row weight constant. Additional nodes in the extended area will increase the column weight for the extended H-matrix. In some configurations, the increase in column weight may be distributed as uniformly as possible across the extensions, increasing the column weight incrementally. The column weight of the first extended parity matrix is greater than the column weight of the primary parity matrix and the column weight of the second extended parity matrix is greater than the column weights of the first extended parity matrix and the primary parity matrix. The extended H-matrix for one or more parity matrix extensions may also be searched to eliminate 4- and 6-cycles. Therefore, any extension of H-matrix from 'basic' size to any extended size will be a 'good' LDPC matrix with reasonable column weight and absence of 4- and 6-cycles.

Figure 5:
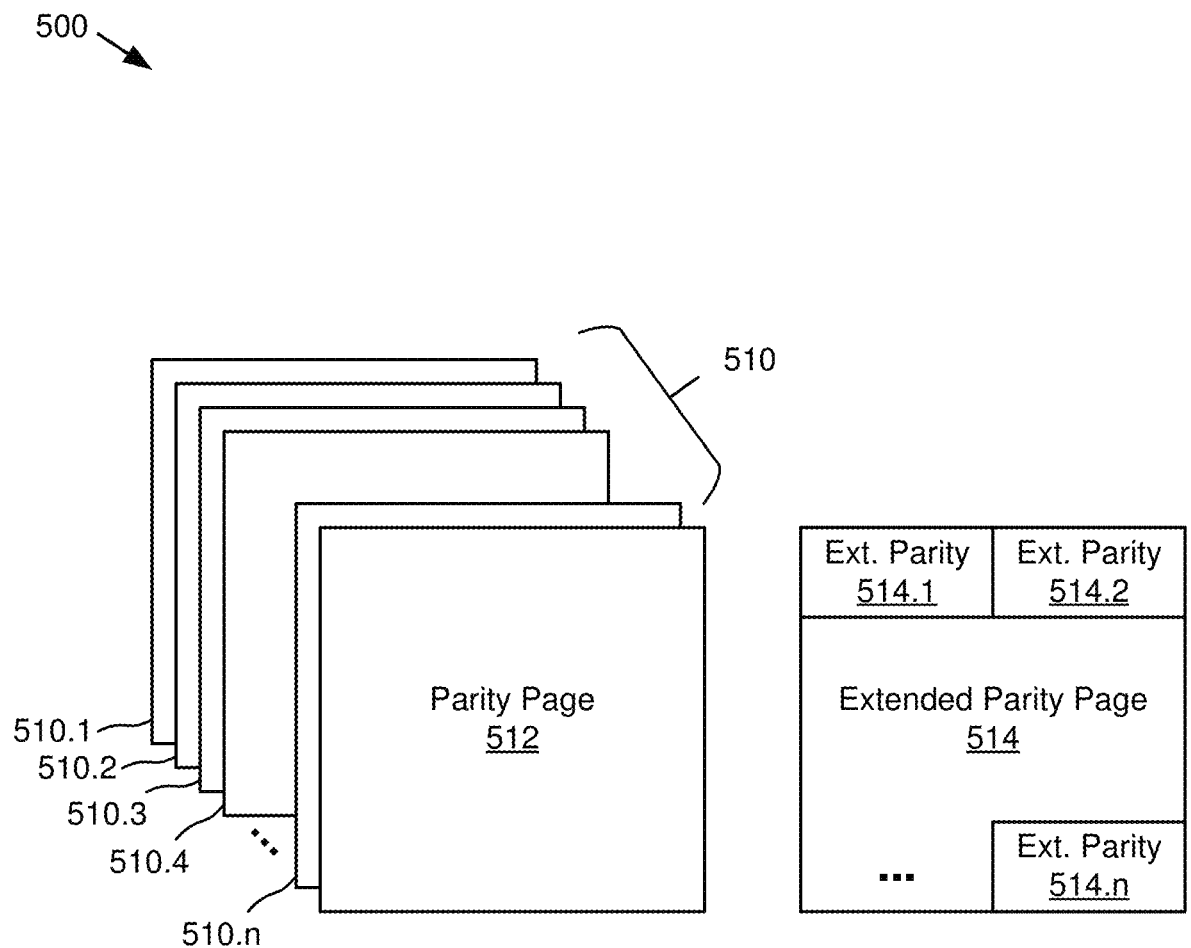
FIG. 5 is a diagram of example extended parity storage locations for solid state memory devices.

FIG. 5 shows an example of how extended parity data may be stored in a non-volatile memory device, such as a solid state memory unit. Host data or other data units may be stored in a plurality of pages 510 configured as data storage locations. For example, each page may receive an LDPC codeword and an associated set of base parity bits. Each page 510.1-510.$n$ may include a distinct codeword for a data unit and may be separately read verified to determine whether extended parity should be used as described above. In some configurations, parity page 512 may be configured as a XOR parity page for data pages 510.1-510.$n$. For example, XOR parity may be calculated by exclusive-or processing of each aligned memory cell across all pages, e.g., $P_1 \oplus P_2 \oplus P_3 \oplus \ldots \oplus P_n = P_{sb}$, where $P_{sb}$ are the resulting parity values for the XORed pages. XOR parity across page may provide some additional information for decoding pages in the set of pages 510, but is uniform across the pages and does not distinguish pages with different storage quality. In some configurations, parity page 512 may be configured to selectively store extended parity only for pages 510 that are determined to use a higher code rate for reliable decoding. For example, some or all of a XOR-configured parity page 512 may be allocated to storing one or more extended parity bit sets for one or more pages 510. For example, where a small number of pages use extended parity, only a small portion of parity page 512 may be allocated to extended parity for specific pages and the remaining bit positions may be used for XOR parity across all pages. In some configurations, cross-page XOR parity may only be used if no pages in that set of pages use extended parity and, if any page is selected for extended parity, parity page 512 may be reconfigured as an extended parity page 514.

Extended parity page 514 may include a page allocated for storing extended parity for a plurality of pages. In some configurations, as described above, extended parity page 514 may be proactively defined or allocated in the memory configuration for defined sets of pages 510 of a predefined number n. In some configurations, extended parity pages 514 may be allocated among reserved pages or unallocated bit lines that are not part of the host data allocation of the memory capacity of the data storage device. In some configurations, extended parity pages 514 may be allocated in a reserved system memory area or one or more reserved memory areas for replacing bad or worn cells over the life of the data storage device.

Extended parity page 514 may comprise a series of extended parity bit sets 514.1-514.$n$. Because extended parity may be determined on a per page basis and not all pages will need extended parity, extended parity page 514 may not include extended parity bit sets for every page, only selectively for those pages selected for extended parity. Similarly, the data storage device may support multiple extended code rates, so different pages may include extended parity for different code rates and, therefore, have different numbers of extended parity bits occupying different amounts of extended parity page 514. For example, a first page may receive a two-bit extension, while another receives a four-bit extension, and still another an eight-bit extension, and these extended bit sets of different lengths may be stored to sequentially in the same extended parity page 514. In some configurations, the storage device controller may aggregate extended parity bit sets for multiple pages in a parity buffer and write the extended parity bits for a set of pages in a single page write operation. Trigger conditions for writing the parity buffer to a page may be based on predefined formatting (e.g., an extended parity page allocated to a predetermined number of data pages), substantially filling the extended parity page (e.g., based on a buffer full threshold), based on timed or number of operation commit thresholds, or other event-based commit triggers.

Figure 6:
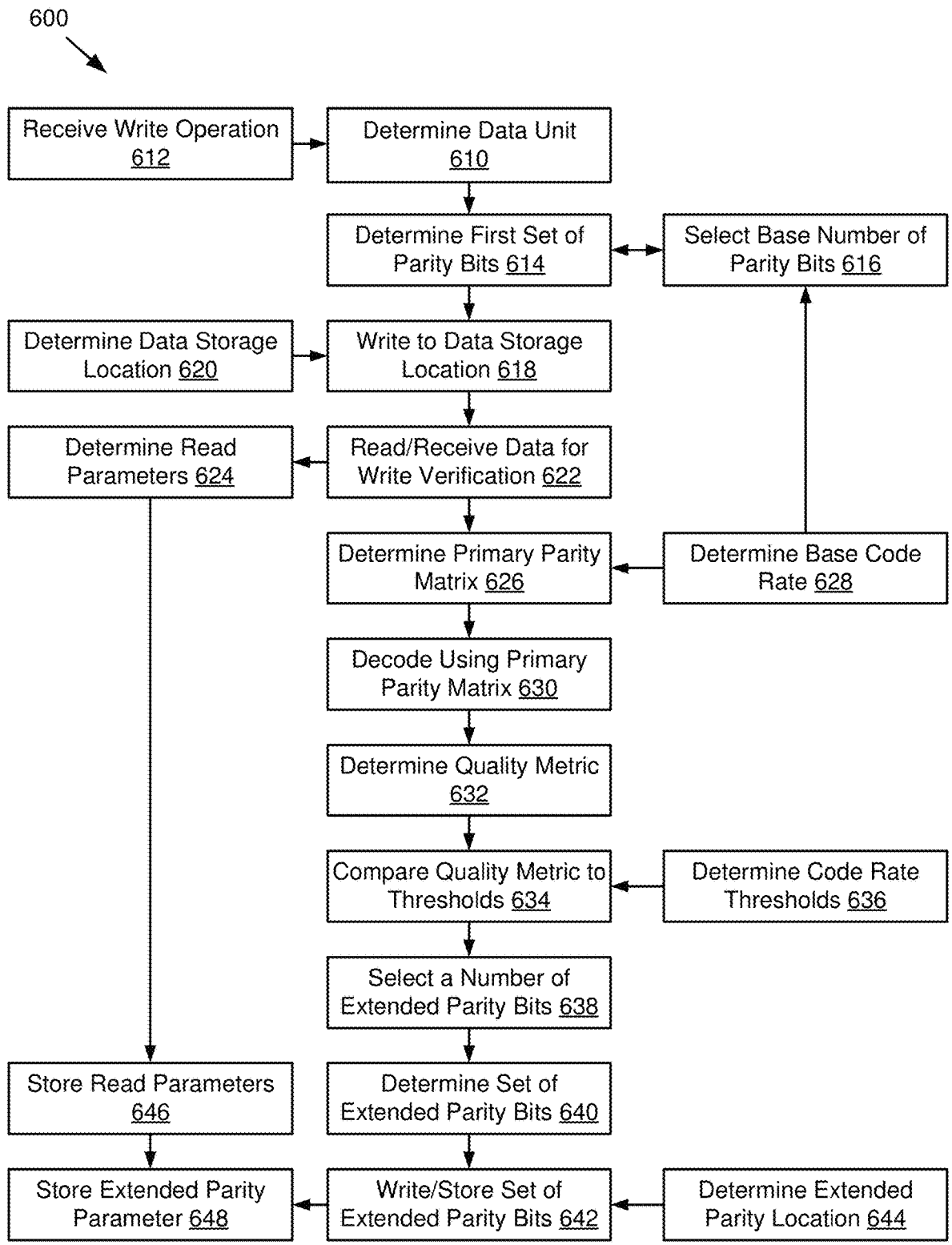
FIG. 6 is an example method of storing data using adjustable code rates based on extended parity.

As shown in FIG. 6, control circuitry 300 may be operated according to an example method of storing data using adjustable code rates based on extended parity, i.e., according to the method 600 illustrated by blocks 610-646. In some configurations, blocks 610-646 may be implemented by a read/write channel circuit controlled by a storage manager with parity write logic and write verify logic.

At block 610, a data unit may be determined. For example, the storage manager may select a set of host data to be stored to the non-volatile storage medium of the data storage device.

At block 612, a write operation may be received. For example, in some configurations, method 600 may be responsive to one or more write operations for host data units received from a host system through a host interface.

At block 614, a first set of parity bits may be determined. For example, an ECC processor may receive the data unit determined at block 610 and encode it according to the ECC encoding configuration of the read/write channel. In some configuration, the ECC processor may calculate a maximum set of parity bits for the data unit and select a base subset of those parity bits for the data unit write to the data storage location.

At block 616, a base number of parity bits may be determined. For example, the ECC processor may be configured with a base number of parity bits used in the primary parity matrix and may use the base number for determining the base set of parity bits to be stored with the data unit.

At block 618, the data unit may be written to a data storage location. For example, the read/write channel may pass the write data for a page comprising the codeword and base parity for the data unit to the non-volatile memory for storage in a specific data storage location.

At block 620, the data storage location may be determined. For example, the storage manager may determine a physical storage location, such as a page in the non-volatile memory devices, to receive the data unit and map the physical storage location to a logical storage location for the data unit.

At block 622, read data for write verification may be read and received from the non-volatile memory. For example, a write verification operation may immediately follow writing the data unit to the data storage location, reading the written codeword and base parity back from the non-volatile memory.

At block 624, read parameters may be determined for the data unit. For example, the data storage device controller may use the read signal to evaluate the signal characteristics and determine a read voltage and/or other parameters to be used for subsequent read operations and balance reliable readback with limiting read-induced errors and wear to the memory cells.

At block 626, the primary parity matrix may be determined. For example, the ECC processor may be configured with a primary parity matrix using the base number of parity bits and serving as the base parity matrix that may be extended by one or more extensions to support additional (higher) code rates.

At block 628, the base code rate may be determined. For example, the ECC processor may be configured for a base code rate corresponding to a minimum level of ECC to be used for reading data units from the non-volatile memory and defining the base number of parity bits and size of the primary parity matrix.

At block 630, the data unit may be decoded using the primary parity matrix. For example, the ECC process may use the primary parity matrix to decode the codeword read from the non-volatile memory.

At block 632, a quality metric may be determined. For example, the ECC processor may calculate a quality metric based on the bit detection and/or soft information from the decoding operation compared to the known codeword written to the non-volatile memory at block 618.

At block 634, the quality metric may be compared to one or more code rate thresholds. For example, the storage device controller may compare at least one quality metric, such as BER or a mutual information metric, to a set of code rate thresholds that correlate quality metric values to a desired code rate for future read operations.

At block 636, the code rate thresholds may be determined. For example, during data storage device design and/or configuration, the storage device controller may be configured with a set of code rate thresholds mapping ranges of at least one quality metric to varying code rates that achieve a desired overall BER for the data storage device when applied to data storage locations having that quality metric.

At block 638, a number of extended parity bits may be determined. For example, based on the comparison of the quality metric to the code rate thresholds, the storage device controller may determine the selected code rate and corresponding number of extended parity bits to support that code rate.

At block 640, the set of extended parity bits may be determined. For example, the storage device controller may select a subset of the maximum number of parity bits previously calculated by the ECC processor and/or may instruct the ECC processor to recalculate parity to the desired number of extended parity bits using the data unit still present in the write buffer.

At block 642, the extended set of parity bits may be stored and written to non-volatile memory. For example, the storage device controller may write the extended set of parity bits to an extended parity page in the non-volatile memory.

At block 644, the extended parity location may be determined. For example, the storage device controller may determine a parity page to receive the set of extended parity bits for that data unit and corresponding data page.

At block 646, read parameters may be stored. For example, the storage device controller may store the read parameters determined at block 624 to a memory parameters data structure indexed by the specific data storage location to which the read parameters apply.

At block 648, an extended parity parameter may be stored. For example, the storage device controller may store an extended parity parameter indicating the existence, size, and/or location of the extended parity bits in the memory parameters data structure for that data storage location.

Figure 7:
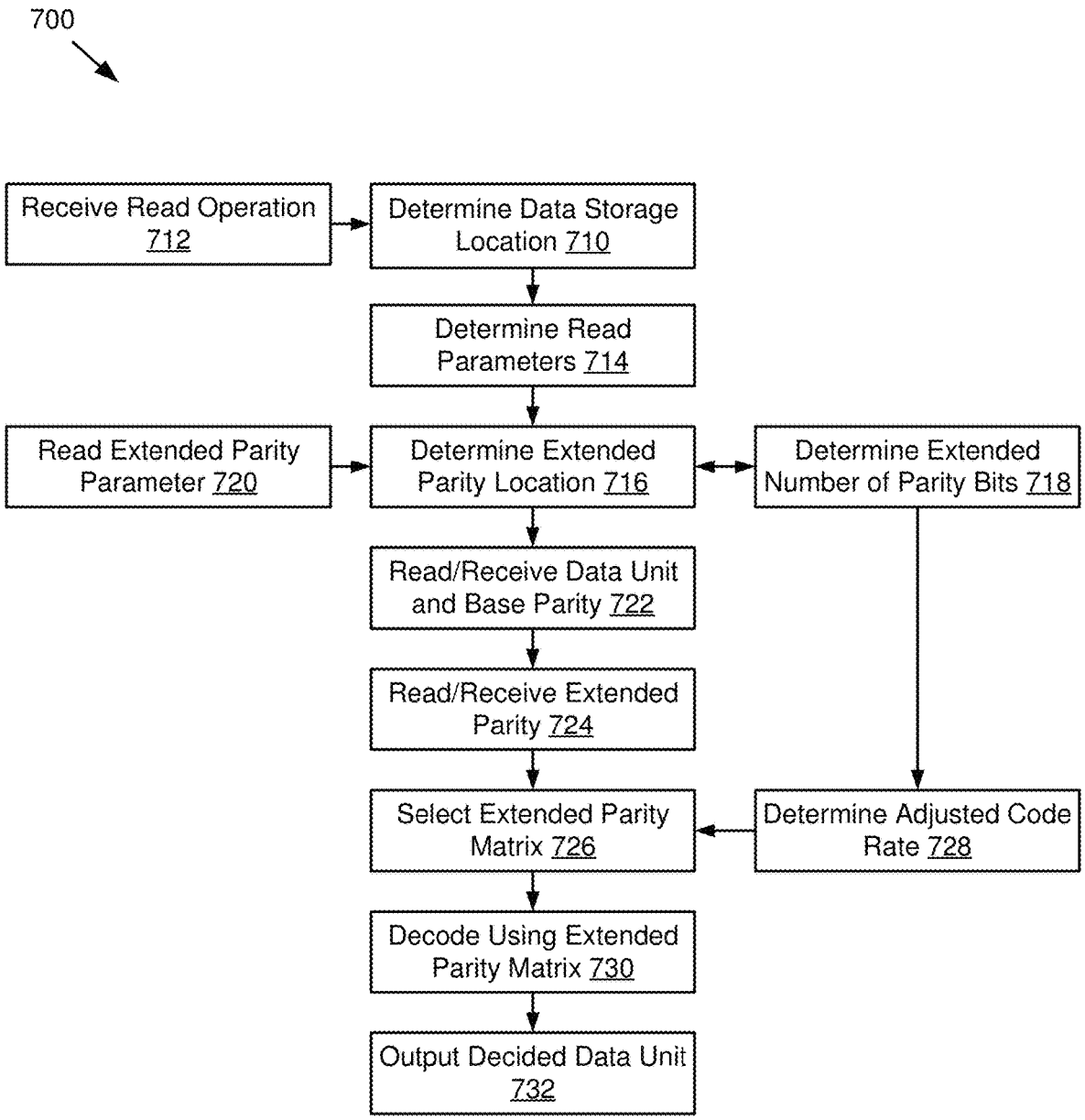
FIG. 7 is an example method of reading data using adjustable code rates based on extended parity.

As shown in FIG. 7, control circuitry 300 may be operated according to an example method of reading data using adjustable code rates based on extended parity, i.e., according to the method 700 illustrated by blocks 710-732. In some configurations, blocks 710-732 may be implemented by a read/write channel circuit controlled by a storage manager with parity read logic.

At block 710, a data storage location may be determined. For example, the storage manager may determine a target data unit and the corresponding physical storage location (e.g., page) in the non-volatile memory.

At block 712, a read operation may be received. For example, in some configurations, method 700 may be responsive to one or more read operations directed to a data unit previously stored in the non-volatile memory, such as according to method 600 in FIG. 6.

At block 714, read parameters may be determined. For example, the data storage controller may access the read parameters previously stored for the target data unit and data storage location.

At block 716, an extended parity location may be determined. For example, the data storage controller may use an extended parity parameter stored with the read parameters, a predetermined extended parity location corresponding to the data storage location, or another lookup, indicator, or function to determine where any extended parity bits for the page or data unit may be located.

At block 718, a number of extended parity bits may be determined. For example, the lookup, indicator, function, or extended parity storage location itself may indicate the number of extended parity bits that were stored for that data unit or page.

At block 720, the extended parity parameter may be read. For example, in configurations using an extended parity parameter, that parameter may be read with the read parameters and selectively indicate to the storage device controller that extended parity is available for the target data unit or page.

At block 722, the data unit and base parity may be read and received from the non-volatile memory. For example, the storage device controller may execute a read operation for the target page to the non-volatile memory and receive the corresponding read signal from the non-volatile memory.

At block 724, the extended parity may be read and received from the non-volatile memory. For example, the storage device controller may execute a read operation for an extended parity page including the set of extended parity bits for the data unit or page.

At block 726, an extended parity matrix may be determined. For example, the ECC processor may select the extended parity matrix corresponding to the adjusted code rate and number of extended parity bits received at block 724.

At block 728, an adjusted code rate may be determined. For example, the number of extended parity bits determined at block 718 and received at block 724 may correspond to an adjusted code rate that is lower than the base code rate of the primary parity matrix.

At block 730, the data unit may be decoded using the extended parity matrix. For example, the ECC processor may use the combination of the base parity read with the data unit and the extended parity from block 724 to decode the data unit using the extended parity matrix selected at block 726.

At block 732, the decoded data unit may be output. For example, the storage device controller may output the decoded data unit to a buffer memory or to the host system that issued the read command for the read operation at block 712.

Figure 8:
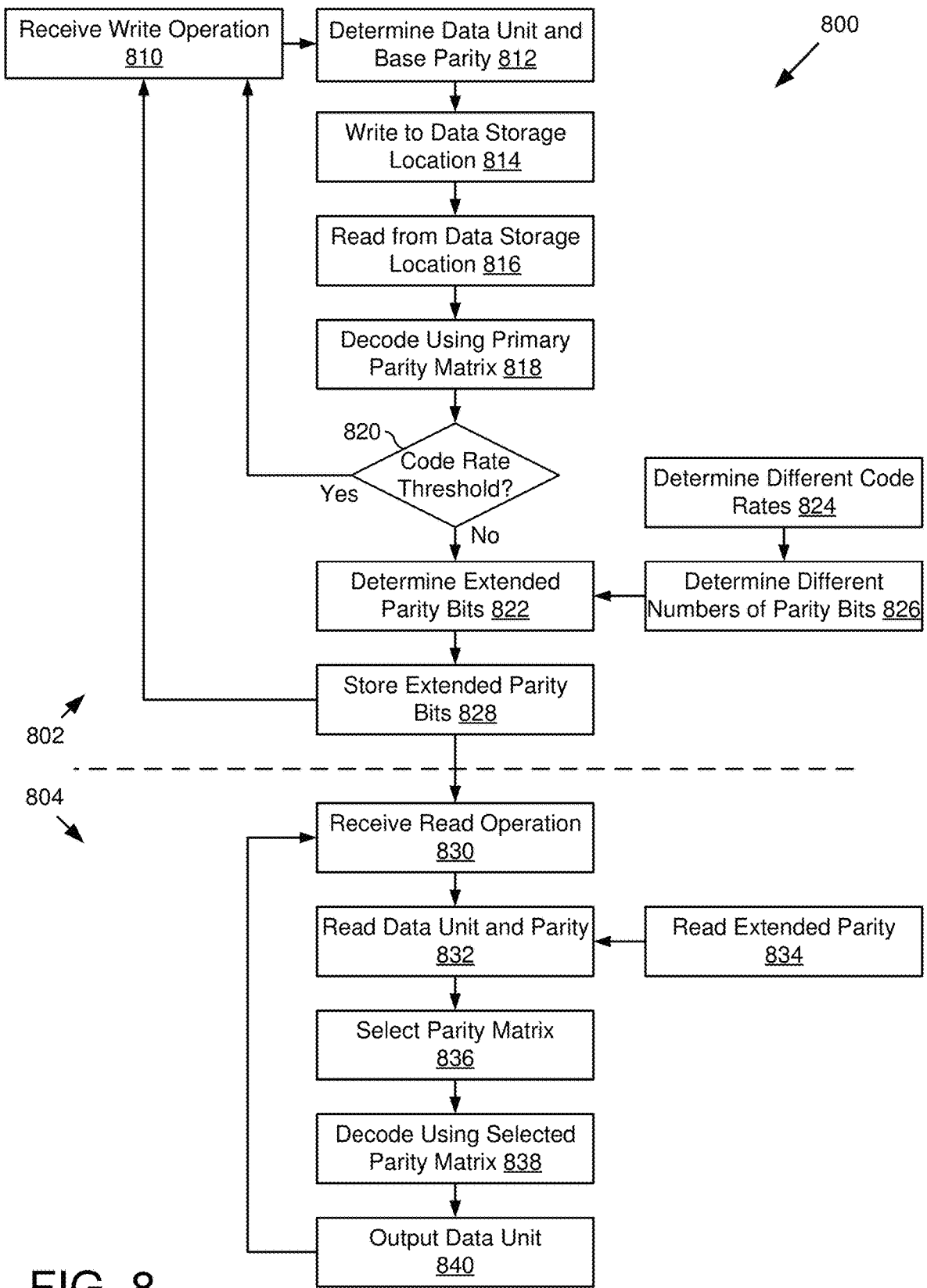
FIG. 8 is an example method of processing write operations and read operations using adjustable code rates based on extended parity.

As shown in FIG. 8, control circuitry 300 may be operated according to an example method of processing write operations and read operations using adjustable code rates based on extended parity, i.e., according to the method 800 illustrated by blocks 810-840. In some configurations, blocks 810-840 may be implemented by a read/write channel circuit controlled by a storage manager with parity write logic, write verify logic, and parity read logic. Method 800 may include a write method 802 for writing a plurality of data units to the non-volatile memory and a read method 804 for subsequently reading of the plurality of previously stored data units.

At block 810, a write operation may be received. For example, a data storage device may receive a host write command to write host data to the non-volatile memory.

At block 812, a data unit and base parity may be determined. For example, the storage device controller may allocate host data to a data unit and calculate a codeword and base parity for that data unit.

At block 814, the data unit and base parity may be written to a data storage location. For example, the storage device controller may determine a physical storage location, such as a page, in the non-volatile memory and write the encoded data unit and base parity to the data storage location.

At block 816, the data unit and base parity may be read back from the data storage location. For example, the storage device controller may use a write verification read operation to read back the encoded data unit and base parity written at block 814.

At block 818, the data unit may be decoded using a primary parity matrix. For example, the ECC processor of the storage device controller may include a primary parity matrix corresponding to the number of parity bits in the base parity.

At block 820, whether a code rate threshold is met for varying the code rate with extended parity may be determined. For example, based on a comparison of at least one quality metric value from the decode operation to at least one code rate threshold value, the storage device controller may determine whether the extended parity bits should be determined and stored for the target data unit and data storage location. If a code rate threshold for the base parity is met, meaning that the data unit may be successfully decoded using the base parity, no extended parity may be stored and method 800 may return to block 810 to receive a next write operation (and/or proceed to read method 804 if the next operation is a read operation). If the code rate threshold for the base parity is not met, extended parity may be determined for the data storage location. In some configurations, block 820 may support a plurality of code rate thresholds correlating different quality metric values to a plurality of sequential parity extensions corresponding to increasing code rates.

At block 822, extended parity bits may be determined for the data unit and data storage location. For example, the storage device controller may use the ECC processor to determine a set of extended parity bits corresponding to the code rate determined by the code rate thresholds at block 820.

At block 824, different code rates may be determined. For example, in some configurations, the storage device controller may support a plurality of higher code rates and corresponding numbers of extended parity bits and extended parity matrices.

At block 826, different numbers of parity bits may be determined. For example, in some configurations, for each data unit, the storage device controller may select a number of parity bits corresponding to the different code rates based on the code rate thresholds.

At block 828, extended parity bits may be stored for the data unit and data storage location. For example, the storage device controller may store the extended parity bits determined at block 822 in an extended parity page for use in subsequent read operations. As each write operation completes (with or without extended parity), method 800 may return to receive a next write operation at block 810 and/or receive a read operation at block 830.

At block 830, a read operation may be received. For example, the data storage device may receive a host read command targeting a data unit previously stored to the non-volatile memory.

At block 832, the data unit and base parity may be read from the data storage location. For example, the host read command may target a host data unit with a logical storage location and the storage device controller may determine a corresponding physical storage location (e.g., page) and execute a read operation from the non-volatile memory to generate a read signal from the previously stored data.

At block 834, extended parity may be read. For example, some data units may have been stored to data storage locations selected for extended parity and, for those data units, the storage device controller may read and retrieve the extended parity bits from a corresponding extended parity location.

At block 836, a parity matrix may be selected. For example, the ECC processor may include a primary parity matrix and at least one extended parity matrix based on the primary parity matrix and the ECC processor may select the parity matrix that corresponds to the available base parity or extended parity for that data unit and data storage location.

At block 838, the data unit may be decoded using the selected parity matrix. For example, each data unit and its corresponding base and any extended parity bits may be processed through the selected parity matrix to decode the data unit.

At block 840, an decoded data unit may be output. For example, the ECC processor may successfully decode each data unit using the corresponding parity matrix for the code rate of the available parity and the read/write channel may return the decoded host data unit for return to the host system through the host interface. Method 800 may return to block 830 for a next read operation or block 810 for a next write operation and thereby store and read a plurality of different data units stored at different code rates based on the actual read performance of the write verification read operation.

Figure 9:
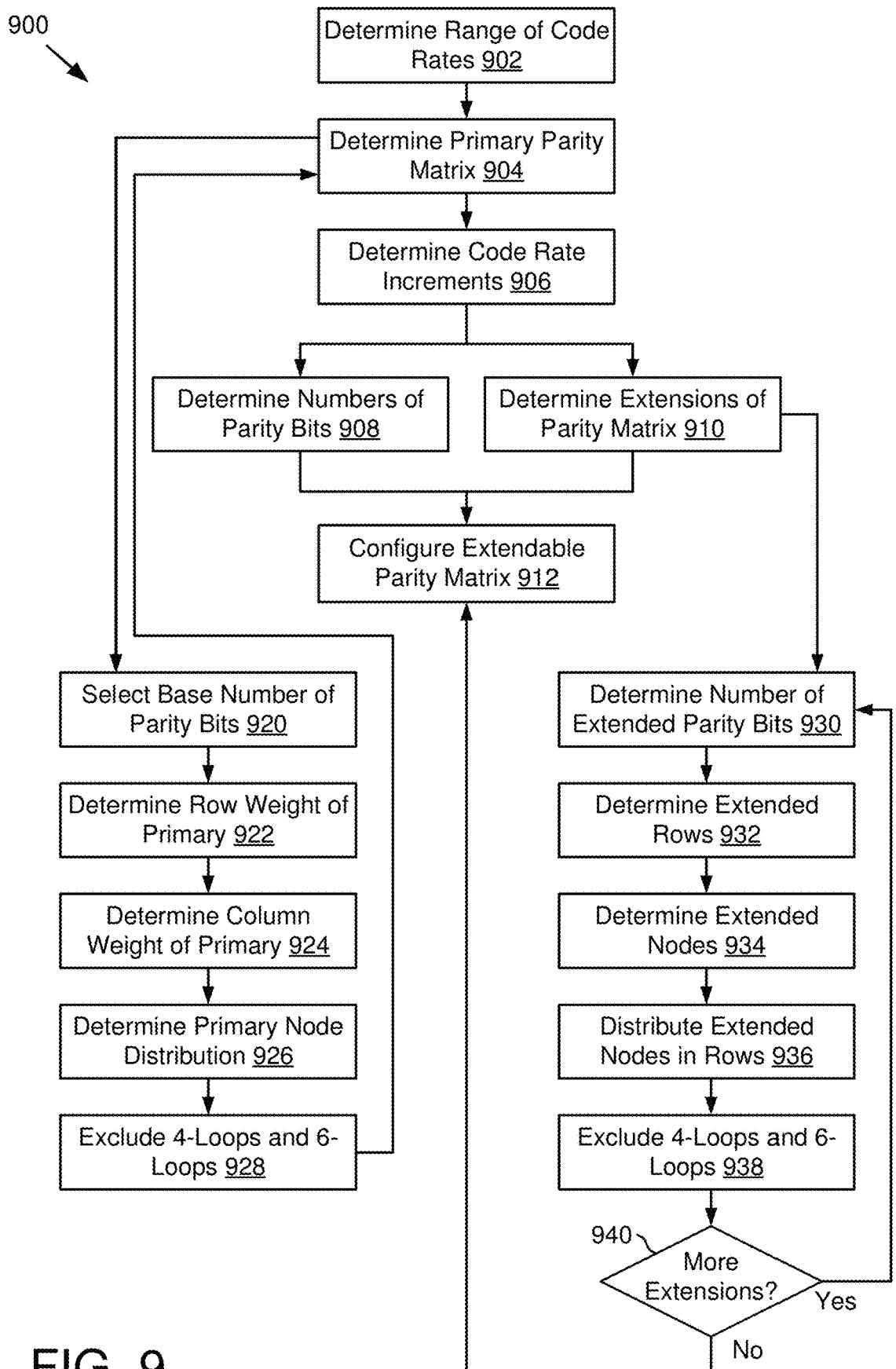
FIG. 9 is an example method of determining and configuring extendable parity matrices.

As shown in FIG. 9, control circuitry 300 may be configured according to an example method of determining and configuring extendable parity matrices, i.e., according to the method 900 illustrated by blocks 906-940. In some configurations, blocks 906-940 may be implemented using a processor, memory, and circuit and/or firmware design tools to configure a set of extended parity matrices and corresponding LDPC codes for a population of data storage devices.

At block 902, a range of code rates may be determined. For example, the design tool may receive, from a user, maximum and minimum code rates to be supported by a data storage device.

At block 904, a primary parity matrix may be determined. For example, the design tool may determine, based on user input, a primary parity matrix based on the minimum code rate to be used by the data storage device. Blocks 920-928 describe example steps for determining the primary parity matrix.

At block 906, code rate increments may be determined. For example, the design tool may determine, based on user input, incremental code rates from the minimum to the maximum code rate, such as step increases of the code rate by a predetermined increment.

At block 908, the number of parity bits may be determined. For example, the design tool may determine the number of parity bits needed to support the desired code rate at each increment.

At block 910, extensions of the parity matrix may be determined. For example, the design tool may determine the corresponding node distributions needed for good LDPC codes to support each increment of parity bits. Blocks 930-940 describe example steps for determining extended parity matrices.

At block 912, the extendable parity matrix may be configured for the data storage device. For example, based on the primary parity matrix and the set of extended parity matrices determined at blocks 904 and 910, the design tool may output an extendable parity matrix that uses incremental extensions based on using and extending the prior parity matrix for instantiation in hardware and/or firmware in a read channel circuit.

At block 920, a base number of parity bits may be selected. For example, the design tool may select the number of parity bits corresponding to the minimum code rate from block 1002.

At block 922, row weight may be determined for the primary parity matrix. For example, the design tool may select, based on user input, a row weight for the parity matrix.

At block 924, column weight may be determined for the primary parity matrix. For example, the design tool may select, based on user input, column weights for the parity matrix.

At block 926, the node distribution for the primary parity matrix may be determined. For example, the design tool may select, based on user input, a distribution of node locations across the rows and columns of the primary parity matrix for a valid LDPC code.

At block 928, 4-loops and 6-loops may be excluded. For example, when the nodes are distributed at block 926, an acceptance condition for the distribution may be that no 4-loops or 6-loops are present in the node distribution.

At block 930, a number of extended parity bits may be determined. For example, the design tool may select the next increment of parity bits corresponding to the desired code rate increments of block 906.

At block 932, extended rows may be determined. For example, the design tool may extend the prior parity matrix by a number of rows equal to the number of extended parity bits.

At block 934, extended nodes may be determined. For example, the design tool may determine a number of nodes per column to support a valid LDPC code.

At block 936, the extended nodes may be distributed among the extended rows. For example, the design tool may select, based on user input, a distribution of node locations within the new rows added at block 932 and compatible with the nodes of the prior parity matrix that is being extended.

At block 938, 4-loops and 6-loops may be excluded. For example, when the new nodes are distributed at block 936, an acceptance condition for the distributions may be that no 4-loops or 6-loops are present in the node distribution, including interactions between the new nodes and the existing nodes of prior parity matrix (which may not be changed).

At block 940, if more extensions need to be configured, method 900 may return to block 930 for configuring the next extended parity matrix until all extensions of the parity matrix are determined and the maximum code rate is reached. Extensions may be based on a predetermined number of parity bits in each extension, such as 1, 3, or more parity bits, for predetermined code rate intervals.

Technology for improved data reliability and/or format efficiency using differentiated code rates supported by extended parity matrices and parity data is described. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to particular hardware.

Reference in the specification to "one embodiment" or "an embodiment" means that a particular feature, structure, or characteristic described in connection with the embodiment is included in at least one embodiment or implementation of the disclosed technologies. The appearances of the phrase "in one embodiment" in various places in the specification are not necessarily all referring to the same embodiment or implementation.

Some portions of the detailed descriptions above may be presented in terms of processes and symbolic representations of operations on data bits within a computer memory. A process can generally be considered a self-consistent sequence of operations leading to a result. The operations may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers, or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), erasable programmable read-only memories (EPROMs), electrically erasable programmable read-only memories (EEPROMs), magnetic or optical cards, flash memories including universal serial bus (USB) keys with non-volatile memory or any type of media suitable for storing electronic instructions, each coupled to a computer system bus.

The disclosed technologies can take the form of an entire hardware implementation, an entire software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The terms storage media, storage device, and data blocks are used interchangeably throughout the present disclosure to refer to the physical media upon which the data is stored.

Finally, the processes and displays presented herein may not be inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description above. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A data storage device, comprising:
   a non-volatile storage medium;
   a write channel circuit configured to, responsive to a host write operation:
   calculate a first set of parity bits for a data unit; and
   write the data unit and the first set of parity bits to the non-volatile storage medium; and
   an error correction code processor circuit configured to, responsive to writing the data unit and the first set of parity bits to the non-volatile storage medium:
   receive a first read signal for the data unit from the non-volatile storage medium;
   decode, using a primary parity matrix and the first set of parity bits from the first read signal, the data unit;
   selectively determine, responsive to decoding the data unit, an extended set of parity bits; and
   store the extended set of parity bits for the data unit to an extended parity storage location.

2. The data storage device of claim 1, wherein the error correction code processor circuit is further configured to:
   receive a second read signal for the data unit from the non-volatile storage medium, wherein the second read signal includes the first set of parity bits;
   receive the extended set of parity bits from the extended parity storage location;
   decode, based on the first set of parity bits and the extended set of parity bits, the data unit from the second read signal; and
   output a decoded data unit for the data unit.

3. The data storage device of claim 2, wherein:
   the first read signal is a write verification read signal for the data unit responsive to the host write operation; and
   the second read signal is a read operation read signal responsive to a host read operation.

4. The data storage device of claim 3, further comprising:
   at least one processor configured to execute instructions to:
   determine the extended parity storage location for the data unit; and
   retrieve, during the host read operation, the extended set of parity bits from the extended parity storage location.

5. The data storage device of claim 1, wherein:
   the error correction code processor circuit comprises a plurality of parity matrices, the plurality of parity matrices including:
   a primary parity matrix configured for a first code rate and first number of parity bits; and
   a plurality of extended parity matrices configured for a plurality of additional code rates and incrementally extended numbers of parity bits;
   the extended set of parity bits corresponds to:
   an incrementally extended number of parity bits;
   an adjusted code rate from the first code rate; and
   a corresponding extended parity matrix from the plurality of extended parity matrices.

6. The data storage device of claim 5, wherein:
   the non-volatile storage medium comprises a plurality of memory cells;
   the write channel circuit is further configured to write a plurality of data units to the plurality of memory cells; and
   the error correction code processor circuit is further configured to:
   selectively determine different code rates and different corresponding numbers of parity bits for the plurality of data units; and
   decode the plurality of data units using the different corresponding numbers of parity bits and the plurality of parity matrices.

7. The data storage device of claim 1, wherein the error correction code processor circuit is further configured to:
   determine, based on decoding the data unit, a quality metric for the first read signal;
   compare the quality metric to at least one code rate threshold value; and
   select, based on the comparison of the quality metric to the at least on code rate threshold value, a number of extended parity bits for the extended set of parity bits corresponding to a desired code rate.

8. The data storage device of claim 7, wherein:
   the quality metric is a mutual information metric based on decoding the data unit; and
   the at least one code rate threshold value includes a plurality of mutual information metric threshold values corresponding to incrementally adjusted code rates.

9. The data storage device of claim 1, wherein the write channel circuit is further configured to:
   write the data unit and the first set of parity bits to a first page in the non-volatile storage medium; and
   write, responsive to the error correction code processor circuit determining the extended set of parity bits, the extended set of parity bits to a second page in the non-volatile storage medium.

10. The data storage device of claim 9, wherein the second page in the non-volatile storage medium comprises reserved memory cells unallocated to a storage capacity of the data storage device.

11. A method comprising:
    determining, responsive to a host write operation, a data unit and a first set of parity bits for the data unit;
    writing, to a data storage location in a non-volatile storage medium, the data unit and the first set of parity bits;
    reading, responsive to writing the data unit and the first set of parity bits and from the data storage location in the non-volatile storage medium, the data unit and the first set of parity bits in a first read signal;
    decoding, using a primary parity matrix and the first set of parity bits from the first read signal, the data unit;
    selectively determining, responsive to decoding the data unit, an extended set of parity bits; and
    storing the extended set of parity bits for the data unit to an extended parity storage location.

12. The method of claim 11, further comprising:
reading a second read signal for the data unit from the non-volatile storage medium, wherein the second read signal includes the data unit and the first set of parity bits;
retrieving the extended set of parity bits from the extended parity storage location;
decoding, based on the first set of parity bits and the extended set of parity bits, the data unit from the second read signal; and
outputting a decoded data unit for the data unit.

13. The method of claim 12, wherein:
the first read signal is a write verification read signal for the data unit responsive to the host write operation; and
the second read signal is a read operation read signal responsive to a host read operation.

14. The method of claim 13, further comprising:
determining the extended parity storage location for the data unit; and
retrieving, during the host read operation, the extended set of parity bits from the extended parity storage location.

15. The method of claim 12, further comprising:
selecting, for decoding the data unit from the second read signal, a corresponding parity matrix from a plurality of parity matrices, wherein:
the plurality of parity matrices includes:
a primary parity matrix configured for a first code rate and first number of parity bits; and
a plurality of extended parity matrices configured for a plurality of additional code rates and incrementally extended numbers of parity bits; and
the extended set of parity bits corresponds to:
an incrementally extended number of parity bits;
an adjusted code rate from the first code rate; and
the corresponding extended parity matrix from the plurality of extended parity matrices.

16. The method of claim 15, further comprising:
writing a plurality of data units to a plurality of memory cells in the non-volatile storage medium;
selectively determining different code rates and different corresponding numbers of parity bits for the plurality of data units; and
decoding, during read operations, the plurality of data units using the different corresponding numbers of parity bits and a parity matrix from the plurality of parity matrices.

17. The method of claim 11, further comprising:
determining, based on decoding the data unit, a quality metric for the first read signal;
comparing the quality metric to at least one code rate threshold value; and
selecting, based on the comparison of the quality metric to the at least on code rate threshold value, a number of extended parity bits for the extended set of parity bits corresponding to a desired code rate.

18. The method of claim 17, wherein:
the quality metric is a mutual information metric based on decoding the data unit; and
the at least one code rate threshold value includes a plurality of mutual information metric threshold values corresponding to incrementally adjusted code rates.

19. The method of claim 11, further comprising:
writing the data unit and the first set of parity bits to a first page in the non-volatile storage medium; and
writing, responsive to determining the extended set of parity bits, the extended set of parity bits to a second page in the non-volatile storage medium.

20. A data storage device comprising:
a non-volatile storage medium;
means for determining, responsive to a host write operation, a data unit and a first set of parity bits for the data unit;
means for writing, to a data storage location in a non-volatile storage medium, the data unit and the first set of parity bits;
means for reading, responsive to writing the data unit and the first set of parity bits and from the data storage location in the non-volatile storage medium, the data unit and the first set of parity bits in a first read signal;
means for decoding, using a primary parity matrix and the first set of parity bits from the first read signal, the data unit;
means for selectively determining, responsive to decoding the data unit, an extended set of parity bits; and
means for storing the extended set of parity bits for the data unit to an extended parity storage location.

* * * * *